US009320165B2

(12) United States Patent
Gruber

(10) Patent No.: US 9,320,165 B2
(45) Date of Patent: Apr. 19, 2016

(54) HOUSING COVER PANEL FOR ACCOMMODATING PLUG-IN MODULES

(71) Applicant: CONTINENTAL AUTOMOTIVE GMBH, Hannover (DE)

(72) Inventor: Robert Gruber, Regensburg (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 14/385,547

(22) PCT Filed: Mar. 14, 2013

(86) PCT No.: PCT/EP2013/055193
§ 371 (c)(1),
(2) Date: Sep. 16, 2014

(87) PCT Pub. No.: WO2013/135793
PCT Pub. Date: Sep. 19, 2013

(65) Prior Publication Data
US 2015/0044903 A1 Feb. 12, 2015

(30) Foreign Application Priority Data
Mar. 16, 2012 (DE) .......................... 10 2012 204 145

(51) Int. Cl.
H05K 5/03 (2006.01)
H05K 5/00 (2006.01)
H01R 13/46 (2006.01)
H01R 13/60 (2006.01)

(52) U.S. Cl.
CPC .................. H05K 5/03 (2013.01); H01R 13/46 (2013.01); H01R 13/60 (2013.01); H05K 5/0047 (2013.01); H05K 5/0065 (2013.01); H05K 5/0069 (2013.01)

(58) Field of Classification Search
CPC . H05K 5/0026; H05K 5/0043; H05K 5/0047; H05K 5/0052; H05K 5/0069; H05K 5/0065
USPC .................................................. 439/76.2, 949
See application file for complete search history.

(56) References Cited

U.S. PATENT DOCUMENTS

| | | | | |
|---|---|---|---|---|
| 5,103,375 A | * | 4/1992 | Cottingham | H05K 1/0258 29/832 |
| 5,266,054 A | * | 11/1993 | Duncan | H01R 13/5219 439/559 |
| 5,712,765 A | * | 1/1998 | Lehrmann | B60R 16/0239 257/719 |
| 5,934,913 A | * | 8/1999 | Kodama | H01R 9/091 439/557 |
| 6,007,351 A | * | 12/1999 | Gabrisko, Jr. | H05K 9/0018 438/76.2 |
| 6,022,247 A | * | 2/2000 | Akiyama | B60R 16/0238 439/701 |
| 6,179,628 B1 | * | 1/2001 | Hasegawa | H01R 9/226 439/212 |

(Continued)

FOREIGN PATENT DOCUMENTS

DE 20318863 U1 4/2005
DE 102007036775 A1 2/2009

(Continued)

*Primary Examiner* — Ross Gushi
(74) *Attorney, Agent, or Firm* — Laurence A. Greenberg; Werner H. Stemer; Ralph E. Locher

(57) ABSTRACT

A housing cover panel for a housing of a control unit is formed with apertures for accommodating plug-in modules. A kit includes the housing cover panel and the plug-in modules, a housing component with the housing cover panel and the plug-in modules, a housing with the housing component and a control unit with the housing.

6 Claims, 2 Drawing Sheets

(56) References Cited

U.S. PATENT DOCUMENTS

| | | | | |
|---|---|---|---|---|
| 6,261,105 B1* | 7/2001 | Uezono | H01H 50/048 | 439/76.1 |
| 6,309,244 B1* | 10/2001 | Gundermann | H01R 31/08 | 439/507 |
| 6,343,953 B2* | 2/2002 | Nakamura | H01R 31/08 | 439/559 |
| 6,413,119 B1* | 7/2002 | Gabrisko, Jr. | H01R 13/719 | 439/620.05 |
| 6,428,357 B1* | 8/2002 | Dolinshek | H01R 43/18 | 29/856 |
| 6,434,013 B2* | 8/2002 | Kitamura | H01R 31/08 | 174/50 |
| 6,511,328 B2* | 1/2003 | Molus | H01R 13/741 | 439/502 |
| 6,572,412 B2* | 6/2003 | Beuther | H05K 5/0069 | 439/381 |
| 6,652,292 B2* | 11/2003 | Pratt | H01R 13/6658 | 439/620.09 |
| 6,702,593 B2* | 3/2004 | Ogawa | H01R 31/06 | 439/79 |
| 6,739,893 B2* | 5/2004 | Hallitschke | H05K 5/0069 | 439/248 |
| 6,755,677 B2* | 6/2004 | Kamiya | H01R 43/205 | 439/381 |
| 6,870,096 B2* | 3/2005 | Suzuki | B60R 16/0239 | 174/50 |
| 6,870,097 B2* | 3/2005 | Oda | B60R 16/0238 | 174/50 |
| 6,926,545 B2* | 8/2005 | Fukamachi | H01R 13/6315 | 439/157 |
| 7,037,124 B2* | 5/2006 | Lee | H01R 13/514 | 439/157 |
| 7,094,075 B1* | 8/2006 | Lim | H01R 12/7005 | 439/76.1 |
| 7,108,519 B2* | 9/2006 | Tomikawa | H01R 13/6658 | 439/76.2 |
| 7,144,275 B2* | 12/2006 | Iida | H05K 5/062 | 439/587 |
| 7,209,367 B2* | 4/2007 | Nakano | H05K 3/3405 | 361/775 |
| 7,234,950 B1 | 6/2007 | Wickett | | |
| 7,331,801 B1* | 2/2008 | Eichorn | H01R 12/724 | 439/76.1 |
| 7,396,254 B2* | 7/2008 | Harmelink | H01R 13/518 | 439/540.1 |
| 7,492,600 B2* | 2/2009 | Kane | H05K 5/0069 | 361/752 |
| 7,697,300 B2* | 4/2010 | Brandt | B60R 16/0239 | 361/704 |
| 7,699,622 B2* | 4/2010 | Sakamoto | H01R 13/629 | 439/76.1 |
| 7,760,511 B2* | 7/2010 | Sasaki | H02G 3/088 | 174/520 |
| 7,867,023 B2* | 1/2011 | Keyser | H05K 5/0069 | 439/567 |
| 8,292,639 B2* | 10/2012 | Achammer | H01R 12/585 | 29/832 |
| 8,523,581 B2* | 9/2013 | Martin | H01R 12/724 | 439/83 |
| 8,627,564 B2* | 1/2014 | Blossfeld | H01R 43/18 | 29/592.1 |
| 8,702,450 B2* | 4/2014 | Nass | H01R 13/504 | 439/606 |
| 8,770,989 B2* | 7/2014 | Ohhashi | H01R 13/5202 | 439/589 |
| 8,873,242 B2* | 10/2014 | Wakana | H05K 5/0069 | 361/730 |
| 8,942,001 B2* | 1/2015 | Kawai | H05K 5/0052 | 174/50.5 |
| 8,962,999 B2* | 2/2015 | John | H01R 12/7023 | 174/59 |
| 9,101,066 B2* | 8/2015 | Azumi | H05K 5/069 | |
| 2003/0162421 A1* | 8/2003 | Pratt | H01R 13/6659 | 439/76.1 |
| 2005/0020104 A1* | 1/2005 | Yamamoto | H01R 13/4361 | 439/76.1 |
| 2005/0047095 A1* | 3/2005 | Tomikawa | H05K 3/284 | 361/715 |
| 2005/0122694 A1* | 6/2005 | Kane | H05K 5/0069 | 361/752 |
| 2005/0150674 A1* | 7/2005 | Munoz | H05K 5/0069 | 174/53 |
| 2008/0045061 A1* | 2/2008 | Hayashi | H01R 13/5202 | 439/246 |
| 2014/0045373 A1* | 2/2014 | Kaesser | H01R 13/504 | 439/540.1 |
| 2015/0044903 A1* | 2/2015 | Gruber | H05K 5/0069 | 439/540.1 |

FOREIGN PATENT DOCUMENTS

| | | |
|---|---|---|
| WO | 2012130537 A1 | 10/2012 |
| WO | 2013029892 A1 | 3/2013 |

* cited by examiner

HOUSING COVER PANEL FOR ACCOMMODATING PLUG-IN MODULES

BACKGROUND OF THE INVENTION

Field of the Invention

The present invention relates to a housing cover panel for receiving plug modules, and also to a housing having a housing cover panel.

Owing to the increasing functionality of motor control systems, including owing to the legal requirements for reducing pollutant levels, the number of lines which are to be connected and the complexity of cable harnesses are increasing. The number of lines which have to be connected to the motor control system has now reached a three-digit value. In order to keep the number of connections low, lines in the cable harness have to be combined by means of so-called splice connections. A plurality of lines are pressed together in the splice connection. These connections cannot be produced in an automated manner in the cable harness and are very costly. Therefore, in order to produce an appropriate cable harness architecture, a large number of direct lines are provided and combined in expedient plug-in modules. The plugs are plugged into the plug-in modules. To this end, different forces are required for connection purposes depending on the number of electrical contacts and the size of the plug. Said forces, also known as plug-in forces, are limited and therefore the individual plug-in modules may once again have to be subdivided. In respect of small installation spaces, the cable harness connections are generally intended to be arranged on a device side. The plug-in direction can be designed to be perpendicular to the printed circuit board surface and parallel to said printed circuit board surface, depending on the installation position and cooling direction of the control device. The ultimate aim is to accommodate a large number of relatively small plug-in modules in as small an installation space as possible, so that the cable outgoers are ensured, and assembly on the assembly line can be performed in a simple manner.

For the current concepts and solutions, all plug-in modules are combined in a complex injection-molded part. The complexity is described using the following features:
- dimensional stability of the plastic geometry in the plug-in region of the individual modules
- dimensional stability of the contact position in the plug-in region
- positional tolerance of the contacts in the connection region to the printed circuit board
- flatness of the interfaces to the electronics housing
- complex three-dimensional geometry to the interface to the electronics housing.

Production as an injection-molded part is associated with a high level of expenditure on investment and further constitutes a customer-specific solution. Replacing modules or the arrangement of said modules in combination is possible only with new investment in a complex injection-molding mold.

BRIEF SUMMARY OF THE INVENTION

One object of the present invention is therefore to provide an apparatus for receiving plugs which can be used in a particularly simple and/or diverse manner.

According to the invention, this object is achieved by a housing cover panel having the features of claim 1. Advantageous refinements and developments of the housing cover panel, of a housing component having the housing cover panel, and of a housing having the housing cover panel are specified in the dependent claims.

According to one aspect, a housing cover panel which has cutouts for receiving plug modules is specified. According to a further aspect, a kit of parts which comprises the housing cover panel and the plug modules is specified.

In particular, precisely one plug module is preferably associated with each cutout in the housing cover panel, that is to say each cutout is intended, in particular, to receive precisely one of the plug modules. The housing cover panel is intended, in particular, for a housing for a control device—such as a motor control system for example. By way of example, the housing cover panel is a constituent part of a housing component of the housing. The housing component preferably contains the housing cover panel and the plug modules or comprises the housing cover panel and the plug modules.

In the present context, "cutouts" are understood to be, in particular, passage openings which pass through the housing cover panel completely in a plan view of a connection side which faces outward. In this case, a "connection side which faces outward" is understood to be a side which, in the mounted state of the housing cover panel, is averted from an interior space of the housing in which an electronic circuit structure can expediently be arranged. The connection side which faces outward faces the plug modules. The plug modules are arranged on said connection side in the mounted state.

In an expedient refinement, each of the plug modules— which are preferably manufactured separately from one another—has a plurality of electrical connecting elements. The electrical connecting elements are, for example, contact pins. The electrical connecting elements of the plug modules preferably extend through the cutouts in the housing cover panel.

In addition, in an expedient development, each of the plug modules has a carrier body in which the electrical connecting elements are preferably held in a mechanically stable manner. The carrier body can have a frame which laterally surrounds the electrical connecting elements and is designed with a mating plug, for example, for mechanically stabilizing a plug connection of the plug module. In the mounted state of the plug module, the frame is expediently formed on a side of the carrier body which is averted from the housing cover panel.

The advantage of this solution can be found in the separation of the function of housing and the function of plug connection. The individual plug modules can be of small and compact design. They can have a uniform interface to the printed circuit board and to the housing cover panel.

Particularly in the case of housings for motor control systems, it is advantageous to use the housing cover panel according to the invention. These housings are manufactured in large numbers. The provision of device plugs is time-consuming and costly. Therefore, it should be possible to use the plug modules in as universal a manner as possible. This is made possible by the present invention.

Owing to the invention, the housing component does not have to be designed as a complex injection-molded part. An injection-molding process can advantageously be split into injection-molding individual plug modules—in particular injection molding the individual carrier bodies around the respective electrical connecting elements—and injection-molding the associated housing cover panel, as a result of which a lower level of complexity for the required injection-molding molds can be achieved. The housing cover panel forms, in particular, the interface to the housing and closes off the device—together with the plug modules. Said housing cover panel can also be designed as a partial housing, for example as a housing half-shell.

In one advantageous refinement of the invention, the housing cover panel has cutouts of different sizes and/or cross sections. As a result, it is possible to use correspondingly different plug modules.

In a further advantageous refinement of the invention, at least one of the cutouts has a rectangular cross section. In the present context, a cutout with a rectangular cross section is also understood to be a cutout with rounded corner regions provided that it has pairs of parallel side faces. A rectangular cross section of this kind is a common cross section for plug modules and can be easily produced.

In a further advantageous refinement of the invention, a peripheral recess is formed parallel to the edges of at least one of the cutouts, it being possible for a plug module to sit on and be fastened to said peripheral recess. In other words, the housing cover panel has—in particular on its connection side which faces outward, that is to say on its side which faces the plug modules—a recess which runs along a center line, wherein the center line has the same shape as the outer contour of one of the cutouts. The center line and the cutout are preferably arranged concentrically in this case. Expressed in other terms, one surface of the housing cover panel, through which surface the cutouts pass, has a trench which runs around one—in particular around precisely one—of the cutouts. A trench of this kind is preferably associated with each of the cutouts. The plug module can be fastened particularly well by means of the recess.

In a further refinement, at least one of the plug modules, preferably each of the plug modules, has a carrier body which has, on its side which faces the housing cover panel, a channel. The channel runs, in a plan view of the side which faces the housing cover panel, along the outer contour of the carrier body and is, in particular, inherently closed.

In an advantageous development, a cutout having a peripheral trench is associated with a plug module of this kind having a channel, so that, in the mounted state of the plug module, an edge region of the carrier body, which edge region runs around the channel, engages in the trench, and a section of the housing cover panel, which section is arranged between the cutout and the trench, engages in the channel. In this way, the plug module can be positioned on the housing cover panel in a particularly simple and reproducible manner. In addition, a connection between the plug module and the housing cover panel which is mechanically particularly stable and/or particularly fluid-tight can be achieved.

In a further advantageous refinement of the invention, the housing cover panel comprises a sealing compound with which the plug modules, which are arranged on the housing cover panel, are sealed off with respect to the housing cover panel. This can be achieved by a process of dispensing a sealing bead. Said process is freely programmable and can be matched to the respective solution.

The sealing compound is expediently arranged in the recess and/or in the channel. This has the advantage of a better sealing effect since the sealing compound is locally limited and accordingly can run better around the edges of the control modules. Further details and advantages are explained with reference to the appended figures.

DESCRIPTION OF THE INVENTION

In the following description of a preferred embodiment, identical reference symbols denote identical or comparable components.

Figure 1:
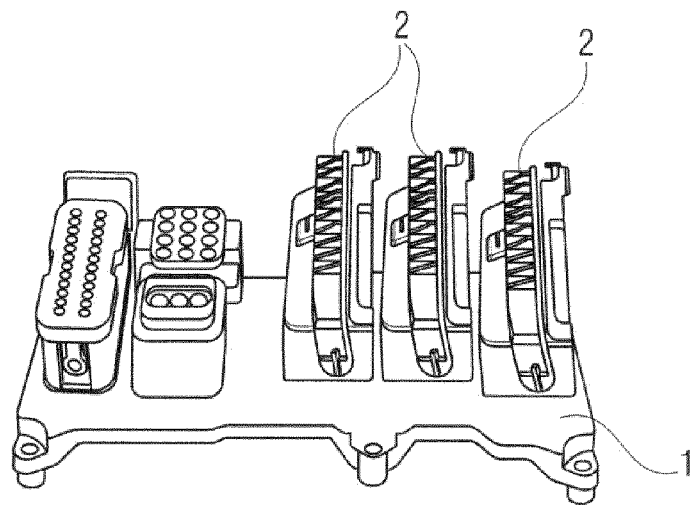
FIG. 1 schematically shows an electrical module having plugs.

FIG. 1 shows an electrical module 1 having plugs 2 arranged on it as per the prior art.

Figure 2:
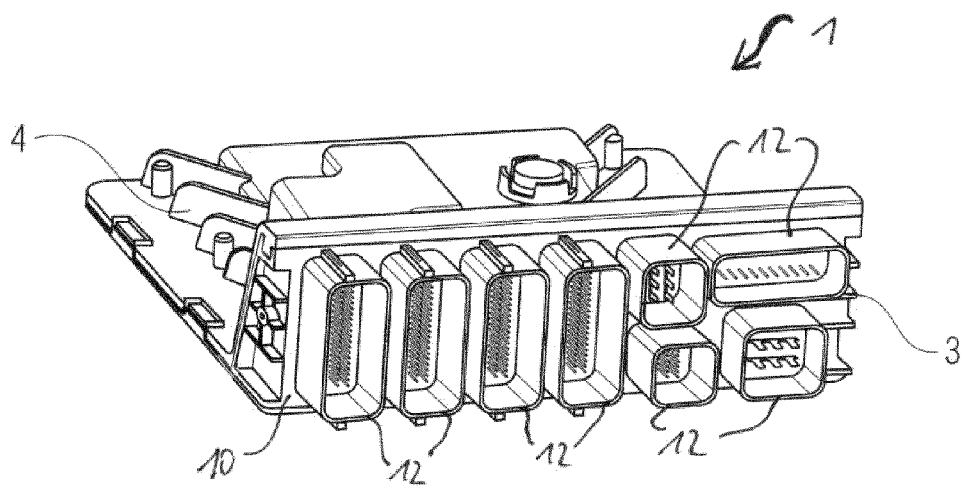
FIG. 2 schematically shows a housing having a plug module unit.

FIG. 2 shows a perspective view of a housing 4, as can be used for electrical modules 1, such as control devices for example. The control device 1 is, for example, a motor control system.

On the front face, the housing 4 has a housing component 3 according to an exemplary embodiment of the invention. The housing component 3 has a plurality of plug modules 12 which are arranged next to one another on a connection side of the housing 4. The plug modules 12, which are manufactured separately, are received in a housing cover panel 10.

Figure 3:
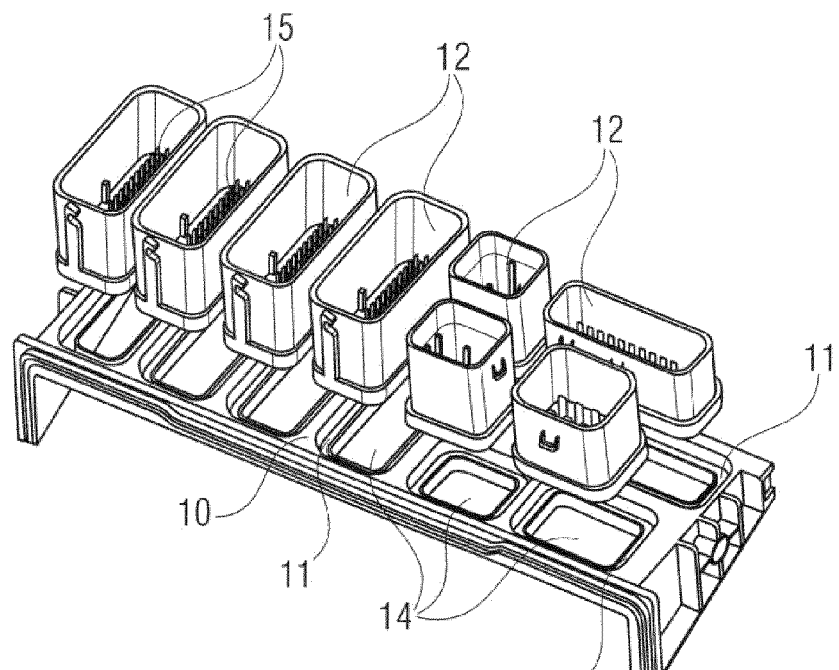
FIG. 3 schematically shows a housing cover panel having plug modules.
Figure 4:
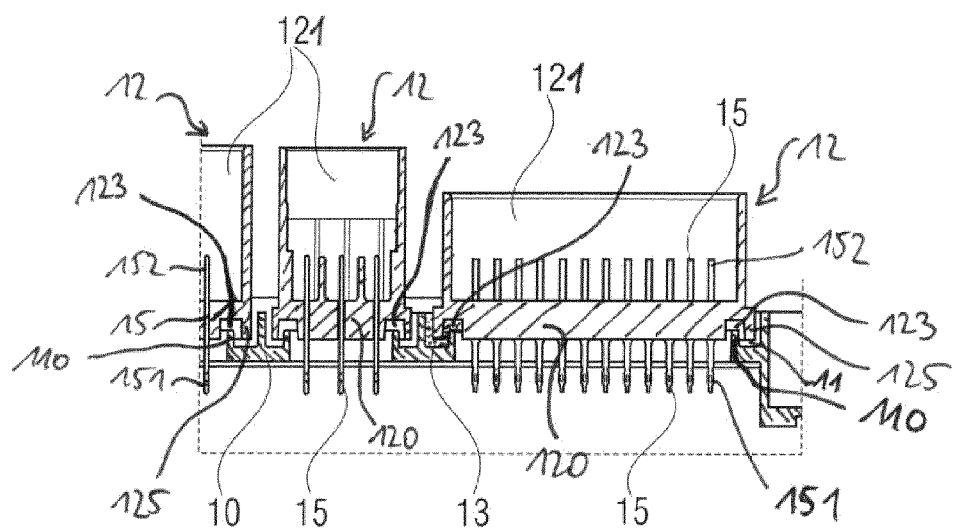
FIG. 4 schematically shows a housing cover panel having plug modules in cross section.

FIG. 3 shows an exploded illustration of the housing cover panel 10 having plug modules 12 of the housing 4 of FIG. 2 in detail. FIG. 4 shows the housing cover panel 10 having the plug modules 12 in cross section.

The housing cover panel 10 and the plug modules 12 are designed as separate parts. The plug modules 12 comprise electrical connecting elements, also called electrical contacts 15 in the text which follows, with which contact can be made from two sides. Expressed in another way, each of the electrical connecting elements 15 has an internal electrical connection region 151 and an external electrical connection region 152 which are formed, in particular, at opposite ends of the respective connecting element 15.

When the housing cover panel 10 having the plug modules 12 is mounted on a housing 4, one side of the contacts 15 points into the housing 4. Said contacts 15 are electrically connected to the electrical units within the housing 4. The other side of the contacts 15 points away from the housing 4, so that said contacts 15 can be electrically connected to external plugs. Expressed in another way, the internal electrical connection regions 151 are formed on a side of the respective plug modules 12 which faces the housing cover panel 10, and the external electrical connection regions 152 are formed on a side of the respective plug modules 12 which is averted from the housing cover panel 10.

The internal electrical connection regions 151 are intended, in particular, to electrically connect the respective plug module 12 to a circuit arrangement which is arranged in an interior of the housing 4. By way of example, said internal electrical connection regions are pressed into a printed circuit board or soldered to a printed circuit board which is arranged in the interior (not illustrated in the figures). The external electrical connection regions 152 are intended, in particular, to connect the respective plug module 12 to a mating plug, preferably in order to electrically connect the control device 1.

Each plug module 12 has a carrier body 120 in which the electrical connecting elements 15 are held in a mechanically stable manner. The carrier body 120 is, for example, an injection-molded part. The carrier body 120 can be injection-molded around the connecting elements 15 or said connecting elements can be pressed into said carrier body. On that side which is averted from the housing cover panel 10, the carrier bodies 120 each have frames 121 which laterally surround the connecting elements 15 of the respective plug module 12.

Each of the carrier bodies 120 has, on its side which faces the housing cover panel 10, a channel 123. The channel 123 runs, in a plan view of the side which faces the housing cover panel 10, along the outer contour of the carrier body 120 and is inherently closed, that is to say formed so as to run, in particular laterally, completely around the electrical connecting elements 15 of the respective plug module 12.

The housing cover panel 10 has cutouts 14 for receiving the plug modules 12. In particular, the contacts 15 run through the cutouts 14, so that, in the mounted state of the housing component 3, the internal electrical connection regions 151 are arranged on an inner face, and the external electrical connection regions 152 are arranged on an outer face of the housing cover panel 10.

The cross section of the cutouts 14 is accordingly matched to the plug modules 12. A conventional cross section is rectangular. However, any geometric cross sections are feasible.

Peripheral recesses 11 are formed at the edges of the cutouts 14, it being possible for the plug modules 12 to sit on and/or to be fastened to said recesses. Precisely one cutout 14 is associated with each recess 11, so that each of the recesses 11 runs, in a plan view of that side of the housing cover panel on which the plug modules 12 are arranged, around precisely one of the cutouts 14. In this case, each of the recesses 11 runs along a center line which has the same shape as the outer contour of the cutout 14 with which the recess 11 is associated.

In the mounted state, for each plug module 12, an edge region 125 of the carrier body 120, which edge region runs around the channel 123, engages in the recess in the cutout 10 which is associated with the plug module 12. In addition, a section 110 of the housing cover panel 10 which is arranged between the cutout 14 and the recess 11 engages in the channel 123.

A sealing compound 13 can be arranged in the recesses 11 and/or the channels 123 (illustrated by way of example at one point in FIG. 4), so that the plug modules 12 can be sealed off with respect to the housing cover panel 10.

The housing cover panel 10 can comprise plastic or a plastic compound. The geometric dimensions of the housing cover panel 10 are matched to the associated housings 4.

The plug modules 12 are formed individually and can therefore be arranged separately or combined as desired, as a result of which they can be used for various concepts and possibly can also be reused. Furthermore, the plug modules 12 can be used both in the case of control devices 1 with cable outgoers perpendicular to the printed circuit board surface, and also in devices with bent printed circuit boards with a cable outgoer parallel to the main printed circuit.

Overall, this leads to greater flexibility in respect of use and also has an effect on the availability. This is because individual plug modules 12 are simpler, quicker and more cost-effective to manufacture than plug module units. As a result, the development times can be reduced. The price per part of the plug modules 12 can additionally be reduced due to high numbers of units.

The plug modules 12 are sealed off on the housing cover panel 10 by a sealing compound 13 which is arranged in the recesses 11.

The plug modules 12, the cutouts 14, the recesses 11 and the contacts 15 are each identified only by way of example in the figures.

The housing cover panel 10 according to the invention is particularly suitable for housings 4 of motor control devices.

The invention claimed is:

1. A housing component, comprising:
    a housing cover for a housing of a control unit, the housing cover having a plurality of plug modules and a housing cover panel formed with cutouts for receiving the plug modules, said housing cover panel having a connection side facing away from an interior of said housing cover;
    at least one of said plug modules having a carrier body, said carrier body, on a side thereof facing said housing cover panel, being formed with a channel which, in a plan view of a side facing said housing cover panel, runs along an outer contour of said carrier body;
    at least one of said cutouts being formed with a peripheral recess parallel to the edges of said at least one cutout on the connection side of said housing cover panel and a respective plug module being configured to sit on and to be fastened to said peripheral recess;
    said cutout with said peripheral recess being associated with said at least one plug module having said carrier body with said channel, so that, in a mounted state of the housing component, an edge region of said carrier body that runs around said channel, engages in said recess, and a section of said housing cover panel formed between said cutout and said recess engages in said channel; and
    an amount of sealing compound disposed in said peripheral recess for sealing said plug modules that are arranged on said housing cover panel with respect to said housing cover panel.

2. The housing cover according to claim 1, wherein said cutouts have mutually different sizes and/or cross sections.

3. The housing cover according to claim 1, wherein at least one of said cutouts has a rectangular cross section.

4. The housing component according to claim 1, wherein each of said plug modules comprises a plurality of electrical connecting elements extending through said cutouts in said housing cover panel.

5. A housing for a control device of a motor vehicle, comprising a housing component according to claim 1.

6. A control device for a motor vehicle, comprising the housing according to claim 1.

* * * * *